United States Patent

Jones, Jr. et al.

Patent Number: 5,378,885
Date of Patent: Jan. 3, 1995

[54] UNSHIELDED MAGNETORESISTIVE HEAD WITH MULTIPLE PAIRS OF SENSING ELEMENTS

[75] Inventors: Robert E. Jones, Jr., San Jose, Calif.; Mark H. Kryder, Bradford Woods, Pa.; Keith R. Mountfield; Javier I. Guzman, both of Pittsburgh, Pa.

[73] Assignee: Mars Incorporated, McLean, Va.

[21] Appl. No.: 784,582

[22] Filed: Oct. 29, 1991

[51] Int. Cl.$^6$ .......................... G06K 7/08; G11B 5/127
[52] U.S. Cl. ........................................ 235/449; 360/113
[58] Field of Search .......................... 360/113; 235/449

[56] References Cited

U.S. PATENT DOCUMENTS

| Re. 33,383 | 10/1990 | Lazzari | 156/643 |
|---|---|---|---|
| 4,465,925 | 8/1984 | Goi | 235/379 |
| 4,473,799 | 9/1984 | Favre | 324/226 |
| 4,487,306 | 12/1984 | Nao et al. | 194/4 C |
| 4,523,330 | 6/1985 | Cain | 235/379 |
| 4,588,292 | 5/1986 | Collins | 356/71 |
| 4,628,194 | 12/1986 | Dobbins et al. | 235/379 |
| 4,703,378 | 10/1987 | Imakoshi et al. | 360/113 |
| 4,723,072 | 2/1988 | Naruse | 235/454 |
| 4,737,649 | 4/1988 | Naruse | 250/562 |
| 4,749,087 | 6/1988 | Buttifant | 209/534 |
| 4,916,295 | 4/1990 | Chominski | 235/449 |
| 4,988,850 | 1/1991 | Masuda et al. | 360/113 |
| 5,155,643 | 10/1992 | Jones, Jr. et al. | 360/113 |
| 5,159,513 | 10/1992 | Dieny et al. | 360/113 |
| 5,166,849 | 11/1992 | Fedeli | 360/113 |
| 5,193,038 | 3/1993 | Smith | 360/113 |

FOREIGN PATENT DOCUMENTS

| 0097570 | 1/1984 | European Pat. Off. . |
| 2909731 | 9/1979 | Germany . |
| 3802121 | 8/1989 | Germany . |
| 3921420 | 1/1990 | Germany . |
| 661603 | 7/1987 | Switzerland . |
| 1481902 | 8/1977 | United Kingdom . |

OTHER PUBLICATIONS

Cheatham et al, "Magnetoresistive Head Element", IBM Technical Disclosure Bulletin, vol. 19, No. 7, Dec. 1976, pp. 2430-2431.

Schwarz, "Signal Sampling of Pulse-Biased Mr Head", IBM Technical Disclosure Bulletin, vol. 19, No. 8, Jan. 1977, pp. 3222-3223.

Chapman et al, "A New Horizontal M-R Head Structure," IEEE Transactions on Magnetics, vol. 25, No. 5, Sept. 1989.

Chapman, "A New Approach to Making Thin Film Head-Slider Devices," IEEE Transactions on Magnetics, vol. 25, No. 5, Sep. 1989.

Indeck et al, "A Magnetoresistive Gradiometer," IEEE Transactions on Magnetics, vol. 24, No. 6, Nov. 1988.

Kelley et al, "High-Track-Density Coupled Film Magnetoresistive Head," IEEE Transactions on Magnetics, vol. Mag-17, No. 6, Nov. 1981.

O'Day, "Balanced Magnetic Head," IBM Technical Disclosure Bulletin, vol. 15, No. 9, Feb. 1973.

Lazzari et al, "A New Thin Film Head Generation IC
(List continued on next page.)

Primary Examiner—Tinmothy P. Callahan
Assistant Examiner—Trong Phan
Attorney, Agent, or Firm—Davis Hoxie Faithfull & Hapgood

[57] ABSTRACT

A new and improved unshielded horizontal magnetoresistive head is disclosed which utilizes multiple pairs of magnetoresistive elements. The present invention provides a device which is characterized by reduced output signal undershoot amplitudes, and an increased central peak pulse amplitude, while not significantly affecting the resolution of the device. The device is also characterized by increased signal to noise and signal to interference ratios. Magnetoresistive elements utilized in the device may be fabricated and/or manufactured by simplified processes, resulting in fabrication, manufacturing and cost benefits for the magnetoresistive head. Any number of additional magnetoresistive element pairs may be utilized dependent on the accuracy and resolution required by the specific application.

13 Claims, 12 Drawing Sheets

OTHER PUBLICATIONS

Head," IEEE Transactions on Magnetics, vol. 25, No. 5, Sep. 1989.

Heim, "The Sensitivity Function for Shielded Magnetoresistive Heads by Conformal Mapping," IEEE Transactions on Magnetics, vol. Mag-19, No. 5, Sep. 1983.

Gill et al, "A Magnetoresistive Gradiometer for Detection of Perpendicularly Recorded Magnetic Transactions," Journal of Applied Physics, vol. 65, No. 1, Jan. 1, 1989.

Van Ooyen et al, "Magnetoresistance in Laminated NiFe Films," Journal of Applied Physics, vol. 53, No. 3, Part II, Mar. 1982.

Mallison, "'Gradiometer Head' Pulse Shapes," IEEE Transactions on Magnetics, vol. 26, No. 2, Mar. 1990.

Kelley et al, "Dual Element Unshielded Hall Head," IEEE Transactions on Magnetics, vol. Mag-20, No. 5, Sep. 1984.

Pohm et al, "0.075, 1.25 and 2.0 $\mu$m Wide M-R Transducers," Journal of Magnetism and Magnetic Materials, vols. 54-57, Part III, Feb. 1986.

Jeffers, "High Density Magnetic Recording Head," Proceedings of the IEEE, vol. 74, No. 11, Nov. 1986.

UNSHIELDED MAGNETORESISTIVE HEAD WITH MULTIPLE PAIRS OF SENSING ELEMENTS

FIELD OF THE INVENTION

The present invention is related to an improved horizontal magnetoresistive head which is unshielded and which may be utilized for magnetic sensing and reading. In particular, the present invention relates to an improvement over the invention described in U.S. Pat. No. 5,155,643 which is assigned to the assignee of the present invention. The improvement relates to the utilization of multiple pairs of magnetoresistive sensing elements. All of the fabrication and manufacturing techniques and advantages, as well as the cost advantages, of the magnetoresistive head described in U.S. Pat. No. 5,155,643 are equally applicable to the improved device described herein.

The improved magnetoresistive head of the present invention may be utilized in a bill validator to sense the magnetic properties inherent in paper currency, such as U.S. currency, and in many other applications involving magnetic sensing or reading which will be readily apparent to those skilled in the pertinent art in view of the following disclosure.

BACKGROUND OF THE INVENTION

A magnetoresistive head is a sensing or reading head which utilizes magnetoresistive elements to sense or read magnetic information inherent in a magnetic medium. A magnetoresistive element is one whose electrical resistance varies with varying incident magnetic fields.

Many prior art magnetic heads, for a great many applications including coin sensing, determining the contents of a coin tube, currency and bill validation, and determination of the denomination of paper currency or other forms of scrip, are of the inductive type which require a rapidly changing magnetic field in order for magnetic information to be detected and recorded. Magnetoresistive heads, on the other hand, are capable of detecting and reading information inherent in a slowly moving or stationary magnetic field. Prior art magnetoresistive heads are typically difficult to fabricate and consequently, relatively expensive.

SUMMARY OF THE INVENTION

The present invention describes a new and improved magnetoresistive head in which multiple pairs of magnetoresistive sensing elements are situated either in contact with, or adjacent to, the magnetic medium to be read in an unshielded horizontal configuration.

The unshielded horizontal magnetoresistive head disclosed in U.S. Pat. No. 5,155,643 provided for many fabrication and manufacturing advantages as well as their associated cost benefits. The present invention provides for a device having all of the fabrication, manufacturing, and associated cost advantages of the magnetoresistive head disclosed therein. Further, the present invention provides a device which is characterized by reduced output signal undershoot amplitudes and, at the same time, provides for an increased central pulse peak amplitude, while not significantly affecting the resolution of the device. The resulting device also provides for increased signal to interference and signal to noise ratios.

Output signal undershoots, which are present in all resultant output signals derived from a pair of elements, are an area of serious concern in magnetic head sensing and reading. This is because these undershoots interfere with the positive portions of the system response or output signal, or the negative peaks of the undershoots may mistakenly be detected as negative pulses and, therefore, lead to erroneous data processing results. While U.S. Pat. No. 5,155,643 that supplemental circuitry, typically external electrical circuitry, could be employed to detect and reject undesirable undershoots, such supplemental circuitry was described as being application specific and requiring custom design. The present invention provides for an improved device wherein output signal undershoots are substantially reduced, and central pulse peak amplitudes increased, without the need for such circuitry.

The present invention utilizes multiple pairs of magnetoresistive elements, structurally arranged so that the preceding arrangement is physically and structurally situated either completely, or partially, within the spacing between the two elements of the last element pair employed. In this manner, the last pair of elements to be employed lies outside of the preceding element pair(s) and is referred to as an "outboard pair". Thus, each pair of elements, with the exception of the original, or initial, pair of elements is known as an outboard element pair or an "outboard pair".

The basic theory behind the operation of the present invention can be described in the following manner. The resultant signals created by each of the additional outboard pairs will, when combined with one another, serve to reduce the amplitude of system output signal undershoots created by the original element pair. Each outboard pair of elements must have a signal gain which is lower than the gain of the preceding elements so that the positive portions of the resultant outboard signal reduce the undershoot amplitude of the output signal of the original pair without interfering with the central peak pulse. Attendant with the reduction of these output signal undershoots, the present invention also provides for increased central pulse peak amplitude while at the same time avoiding a significant change in the half width at half amplitude of the central pulse, which is a measure of the resolution of the head. As will be described in more detail below, the utilization of additional pairs of magnetoresistive elements will lead to further improvements in the system's resultant or output signal. The number of outboard pairs employed is dictated by the accuracy and resolution required by the specific application.

It is an object of the present invention to provide for a horizontal unshielded magnetoresistive reading head comprised of multiple pairs of sensing elements, for use in magnetic sensing and reading devices and in other related devices to perform analysis or verification of the magnetic properties of certain magnetic media.

It is another object of the present invention to provide for a horizontal unshielded magnetoresistive head comprised of multiple pairs of sensing elements which has the capability to reduce the undershoots of an original dual element magnetoresistive head, and further provide for increased central pulse peak amplitudes while not affecting a significant change in the resolution of the device.

It is yet another object of the present invention to provide for a horizontal unshielded magnetoresistive head comprised of multiple pairs of sensing elements which has improved signal to interference and signal to noise ratios relative to those of a single element pair magnetoresistive head.

It is yet a further object of the present invention to provide simplified fabrication and manufacturing processes and techniques for a multiple element pair horizontal unshielded magnetoresistive head along with attendant fabrication, manufacturing, and cost benefits.

It is yet another object of the present invention to provide a horizontal unshielded magnetoresistive head comprised of multiple pairs of sensing elements which eliminates the need for supplemental application specific circuitry in order to reduce output signal undershoots.

More objects and advantages will become apparent to those skilled in the pertinent art in the description of the detailed embodiment of the present invention below.

The structure and method of use and fabrication of the present invention will be apparent to those skilled in the art from a review of the Detailed Description taken in conjunction with the Drawings.

DETAILED DESCRIPTION

Figure 1:
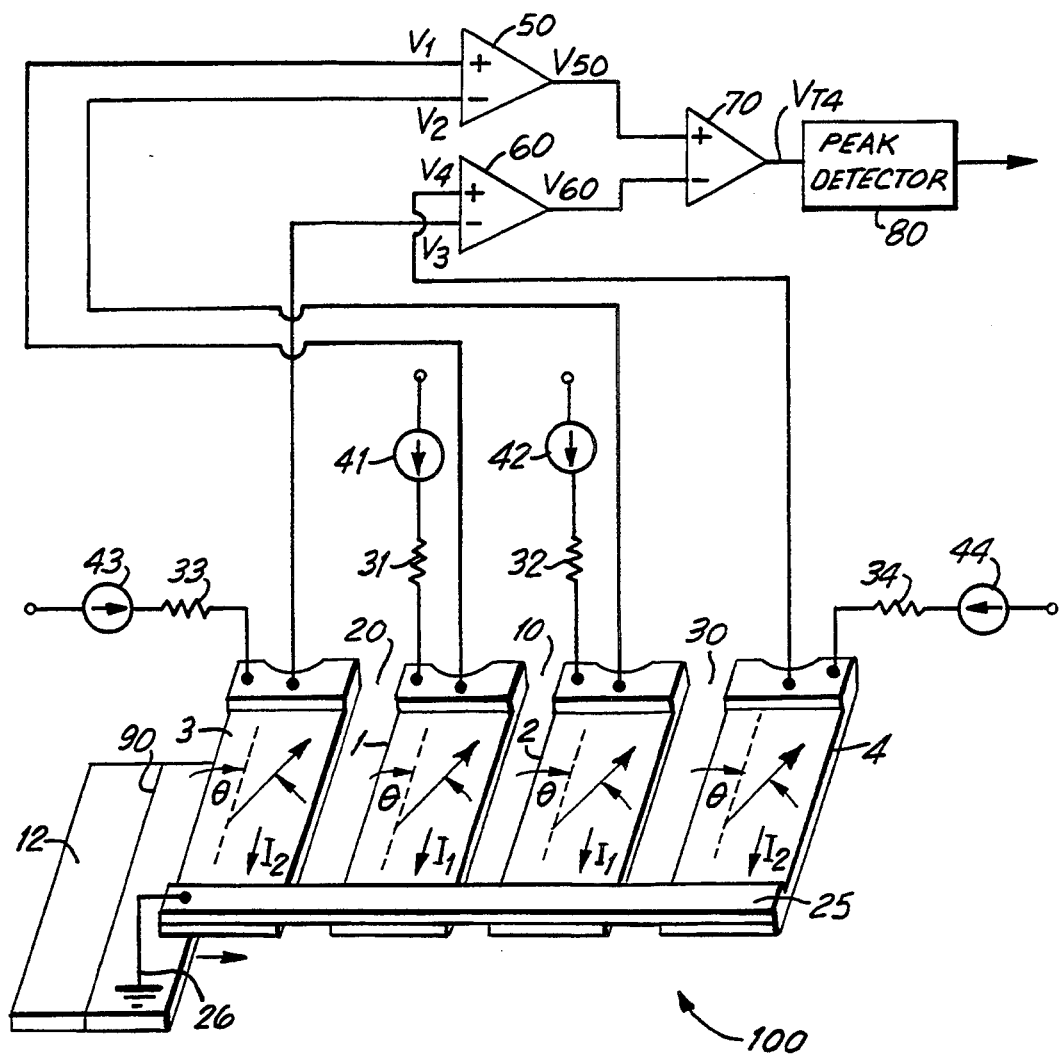
FIG. 1 is an illustration of a two-pair or four-element horizonal unshielded magnetoresistive head according to the present invention shown with its associated hardware and circuitry.

Referring to FIG. 1, a simplified structural depiction of a horizontal unshielded magnetoresistive head with multiple pairs of sensing elements, according to the present invention, is shown and depicted generally by the numeral 100. In this embodiment, two-pairs, or four magnetoresistive sensing elements 1, 2, 3, and 4 lie parallel to one another in the same horizontal plane. While the elements are described as lying in the same horizontal plane, it is also envisioned that the various element pairs could lie on different planes. Magnetoresistive elements 1 and 2 comprise the first pair, herein after referred to as the "original pair". This original pair of magnetoresistive elements comprises essentially the two-element magnetoresistive head arrangement which is the subject of U.S. Pat. No. 5,155,643, which is assigned to the assignee of the present invention and is incorporated by reference herein.

Figure 2:
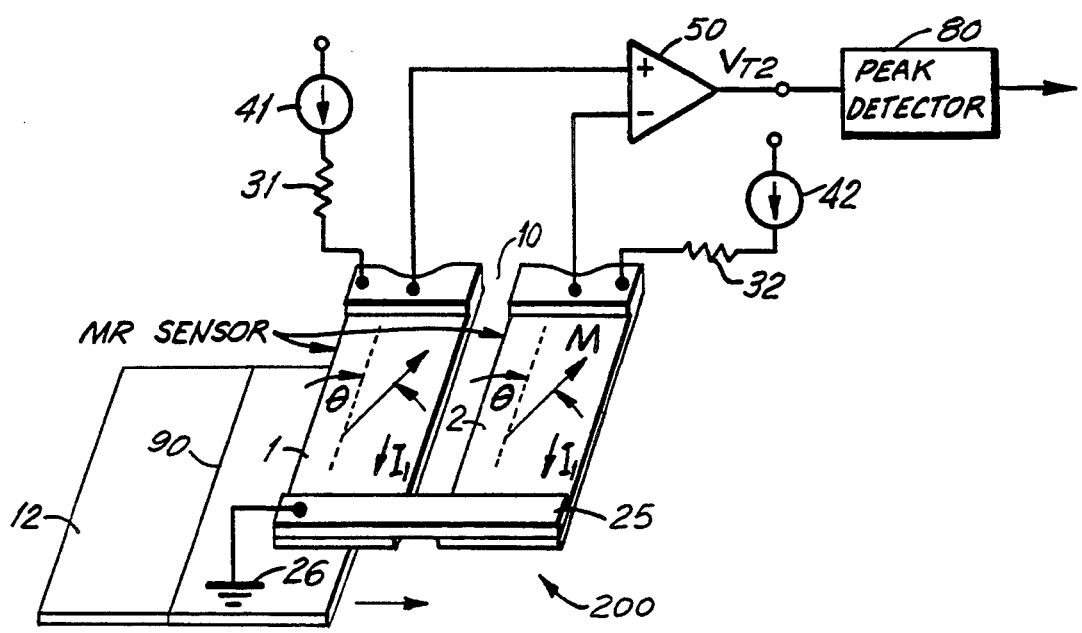
FIG. 2 is an illustration of a two-element horizontal unshielded magnetoresistive head.

FIG. 2 illustrates an original pair magnetoresistive head wherein the magnetoresistive elements 1 and 2, along with their associated hardware and circuitry, is denoted generally by the numeral 200. FIG. 1 depicts a multiple pair magnetoresistive head having magnetoresistive elements 3 and 4 along with the additional hardware and circuitry associated therewith. Elements 3 and 4 comprise what will hereinafter be referred to as the "outboard pair". As can be seen from FIG. 1, the original pair elements 1 and 2 are situated wholly within the space, or gap, between the outboard pair elements 3 and 4. Elements 1 and 2 are separated by a gap 10. Similarly, elements 1 and 3 are separated by gap 20 and elements 2 and 4 are separated by gap 30. Each of the aforementioned gaps 10, 20, and 30 may be filled with air or any other type of dielectric material which is defined as any material capable of sustaining an electrical or magnetic field with minimum dissipation in power. While gaps exist between the elements, it is important to note that such gaps are not required in the present invention. To the contrary, if element pairs are situated on multiple planes, the elements of the various pairs may overlap so that no effective horizontal gaps exist between elements.

Magnetoresistive elements 1, 2, 3, and 4 are connected to one another at one end by a cross member 25. Cross member 25 is an electrical conductor which electrically connects elements 1, 2, 3, and 4 to one another, as well as to a common electrical point 26 which is typically system ground. The ungrounded ends of each of the elements 1, 2, 3, and 4 are connected through resistors 31, 32, 33, and 34, respectively, to constant current supplies 41, 42, 43, and 44, respectively. The respective resistors 31, 32, 33, and 34 associated with a given pair of magnetoresistive elements, or intra-pair resistors, must be of equal resistance values although it is not required that resistors associated with different pairs, or inter-pair resistors, have equal resistance values. Accordingly, resistors 31 and 32, associated with the original element pair (elements 1 and 2), should be of equal resistance values. Similarly, resistors 33 and 34, associated with the outboard pair (elements 3 and 4), should also be of equal resistance values. The ungrounded ends of each of the magnetoresistive elements 1, 2, 3, and 4 are also connected to the inputs of differential voltage sensing devices 50 and 60 which are typically differential amplifiers or operational amplifiers.

The hardware connections of the magnetoresistive elements to their associated differential amplifiers are specified as follows for the given embodiment. The ungrounded end of magnetoresistive element 1 is connected to the positive, or non-inverting, input of differential amplifier 50. The voltage signal generated by element 1 is denoted $V_1$. The ungrounded end of magnetoresistive element 2 is connected to the negative, or inverting, input of differential amplifier 50. The voltage signal generated by element 2 is denoted $V_2$. The ungrounded end of magnetoresistive element 3 is connected to the negative, or inverting, input of differential amplifier 60. Similarly, the voltage generated by element 3 is denoted $V_3$. Finally, the ungrounded end of magnetoresistive element 4 is connected to the positive, or non-inverting, input of differential amplifier 60. The voltage generated by element 4 is denoted $V_4$.

The outputs of the differential amplifiers 50 and 60 are connected to the inputs of differential amplifier 70 in the following manner. The output of differential amplifier 50, denoted $V_{50}$ in FIG. 1, is fed into the positive, or non-inverting, input of differential amplifier 70. The output of differential amplifier 60, which is denoted $V_{60}$ in FIG. 1, is fed into the negative, or inverting, input of differential amplifier 70 as is also shown in FIG. 1.

The output of differential amplifier 70 is the resultant signal $VT_{74}$, also labeled in FIG. 1, for the two-pair or four-element magnetoresistive head of the present invention. $V_{74}$ is further fed into a Peak Detector 80 as shown in FIG. 1 wherein the data derived therefrom will be processed and utilized in additional system processing hardware and circuitry (not shown). It should be noted that a peak detector is only one of several preferred devices or embodiments which may be used to detect signals.

Constant current sources 41, 42, 43, and 44 supply currents ($I_1$ and $I_2$) which flow in the direction indicated by the arrow in the current sources 41, 42, 43, and 44 as well as in the elements 1, 2, 3, and 4 as shown in FIG. 1. The currents ($I_1$ and $I_2$) flow from each of the respective current sources 41, 42, 43, and 44, through resistors 31, 32, 33, and 34, respectively, through the respective magnetoresistive elements 1, 2, 3, and 4 and finally to system ground 26. While currents supplied to the different element pairs may differ (inter-pair currents), it is essential that the currents supplied to the same pair of elements (intra-pair currents) be substantially identical. Different currents ($I_1$ and $I_2$) may be obtained by utilizing different current sources or identical current sources with attendant circuit modifications.

The magnetoresistive elements 1, 2, 3, and 4 should be as thin as possible, within practical design constraints, so as to provide for a maximum voltage change developed across each of the elements for a given magnetic transition or field which is to be sensed or read. Typically these thicknesses should be from 400 to 500 angstroms. This will allow for the achievement of a higher signal amplitude.

To obtain accurate results, the size of the gaps 10, 20, and 30 should be such that no more than one magnetic transition appears within a gap during any given instant in time during the sensing or reading process. For applications requiring a higher resolution, or where closely spaced magnetic transitions are found, small gap sizes are necessary. In low resolution applications, where the magnetic transitions are spaced farther apart, the size of the gaps may be larger as long as multiple transitions do not occur within any one of the gaps during any given instant in time. Thus, the size of the gaps 10, 20, and 30 are governed by the application to which the magnetoresistive head is employed.

Magnetoresistive elements, by their nature, experience a change in electrical resistivity or resistance as a function of the orientation and/or alignment of the magnetic dipole moments that occur in the material when a magnetic field is applied. Unlike inductive heads, magnetoresistive elements may operate to sense a slowly changing magnetic field as well as a stationary magnetic field.

Referring once again to FIG. 1, the structure of the elements which comprises the aforementioned original pair, or elements 1 and 2, have substantially the same electrical characteristics and the same current ($I_1$) flowing through them. The outboard pair, comprised of elements 3 and 4, also have the same electrical characteristics as each other and the same currents ($I_2$) following through the both of them. The circuitry connected to outboard pair elements 3 and 4, however, are chosen such that the response of elements 3 and 4 to a given magnetic field will be only a fraction, k, of the response of elements 1 and 2 to the same field. In this manner, the amplitude of both the positive and negative portions of the signals generated by outboard pair elements 3 and 4 will be proportionately smaller than the corresponding signal and portions thereof generated by the original pair elements 1 and 2.

By utilizing elements of lower sensitivity, the signals generated by each outboard pair will have lower positive and negative amplitudes than the resultant signal of the original pair. The output signal of the outboard pair, when combined algebraically with the signal of the original pair, will serve to reduce the amplitude of the undershoots in the resultant output signal for the head and provide for an increased central pulse peak amplitude, while at the same time, causing no appreciable change in the half width at half amplitude, or head resolution. As will be described in more detail below, the utilization of additional pairs of magnetoresistive elements will lead to further decreases in output signal undershoots along with the attendant improvements in central pulse peak amplitudes.

The lower sensitivity of the outboard pair elements 3 and 4 can be provided by one of several means. These may include for example: 1) constructing the elements from a low permeability material; 2) reducing the current flowing through the outboard pair elements 3 and 4 by a factor k; and 3) employing a differential amplifier 60 having a lower gain than amplifier 50. In the second case, it is assumed that the bias of the magnetoresistive elements does not depend on the current being carried.

As a magnetic field is incident on the elements of the magnetoresistive head, the voltages generated across the original pair, elements 1 and 2, are fed to differential amplifier 50 while the voltages generated across the outboard pair, elements 3 and 4, are fed to differential amplifier 60. The signal $V_{50}$, obtained from the original pair elements 1 and 2, is the difference or algebraic sum of the voltages generated across elements 1 and 2. Similarly, $V_{60}$, obtained from the outboard pair elements 3 and 4, is the difference or algebraic sum of the voltages generated across elements 3 and 4. By utilizing differential amplifiers, the difference signal is obtained by summing one signal with the inverse, or negative, of the other signal.

In the absence of a field or in the presence of a uniform global field, the voltage drops across each of the elements of a given pair will be substantially the same and, therefore, the output of the differential amplifiers 50 and 60 will be essentially 0 volts. This will result in an output signal $V_{T4}$ of 0 volts at the output of differential amplifier 70. When a non-uniform magnetic field is applied proximate the elements 1, 2, 3, and 4 so that they are not affected equally, the respective resistances of each of the elements will vary, and with identical currents passing through the elements of each pair, along with the employment of equal valued resistors for each given pair, the voltage drops across elements 1, 2, 3, and 4 will vary accordingly.

While the change in the resistance of the magnetoresistive elements 1, 2, 3, and 4 is a function of the magnetic field incident thereon, it is also a function of the orientation of the magnetic dipole moments inherent in the material of each of the elements. In order to provide a linear response and to maximize element sensitivity, it is necessary to transversely bias the dipole moments of the elements so as to uniformly orient them away from the easy axis. The easy axis is defined as the intrinsic orientation of the magnetic dipole moments of a material in the absence of an external magnetic or biasing field. The orientation of the dipoles after biasing is typically 45 degrees away from the direction of the flow of current. This angle of orientation is denoted by the angle $\theta$ (theta) in FIG. 1. Any change in this angle of orientation, caused by the application of a magnetic field, will result in a change in the resistivity and resistance of the magnetoresistive elements.

In magnetoresistive material, the resistance of the material also differs depending upon the direction of its measurement in relation to the orientation of magnetization of the dipoles. Resistivity measured parallel to the orientation of the dipole magnetization will differ from resistivity measured perpendicular to the orientation of the dipole magnetization. This difference in resistance is $\Delta R$. In a zero transverse magnetic field, $\Delta R$ is at its maximum value. The resistance R is the resistance of the magnetoresistive element in a zero transverse field.

Figure 3:
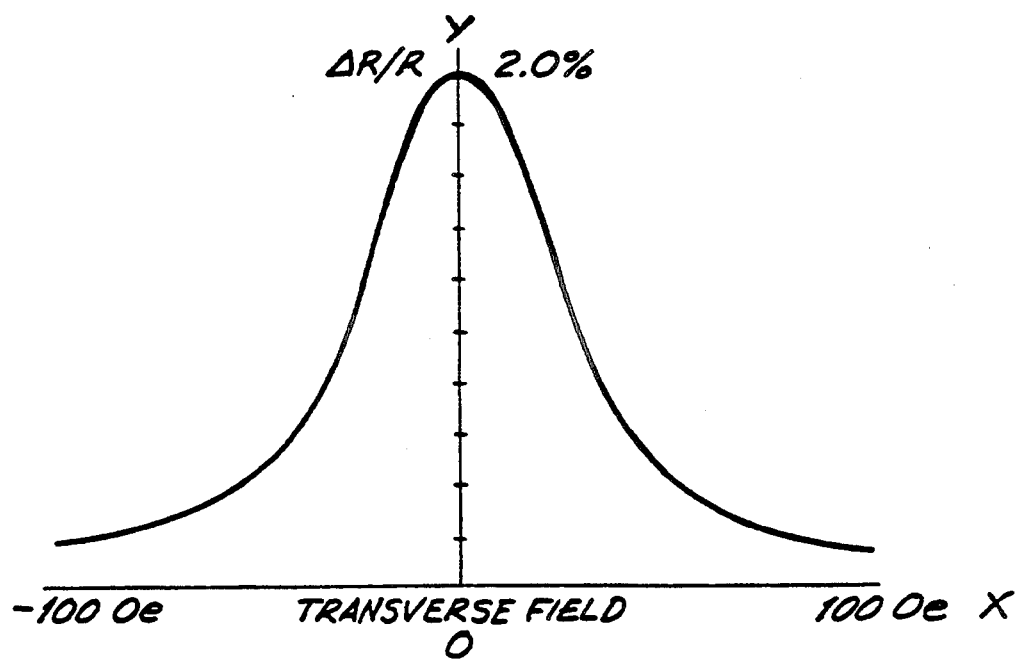
FIG. 3 is an illustration of a magnetoresistive response curve for an element or strip of magnetoresistive material before it is biased in the transverse direction.

The magnetoresistive response curve, which is the ratio of $\Delta R$ to R plotted against the transverse magnetic field which is applied to the magnetoresistive element, is illustrated in FIG. 3. The bell-shaped curve of FIG. 3 experiences a rapid drop off from its peak and then slowly approaches the horizontal axis. A linear relationship of these two parameters is desired for magnetic sensing and reading applications. As a result of the biasing of the dipoles of each of the magnetoresistive elements 1, 2, 3, or 4, the curve of FIG. 3 may be shifted to the left.

Figure 4:
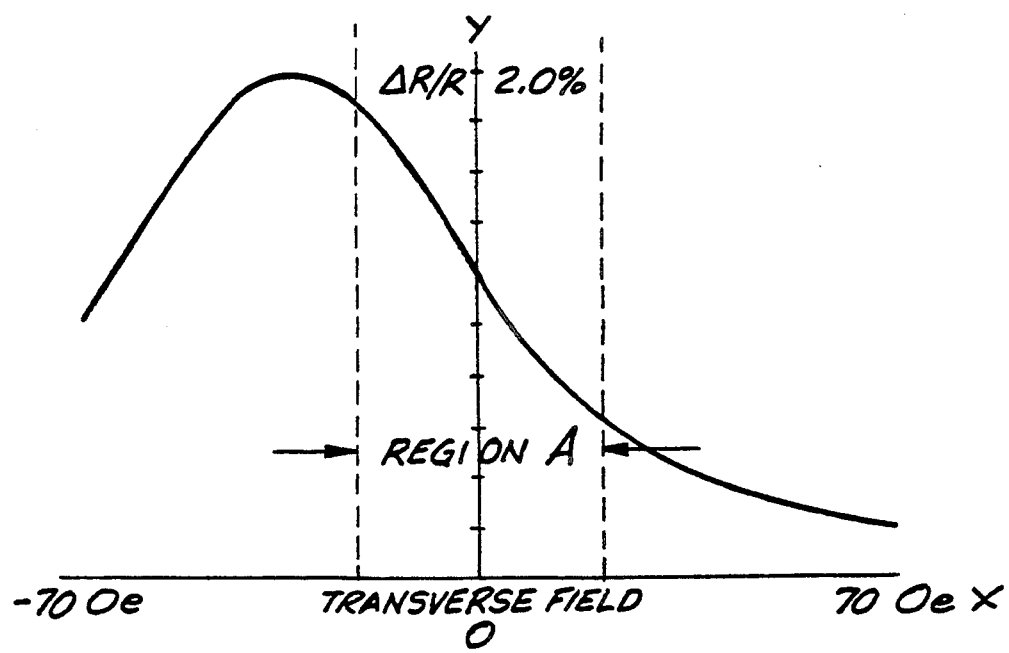
FIG. 4 is a magnetoresistive response curve for a given element or strip of magnetoresistive material after it has been biased in the transverse direction.

FIG. 4 is illustrative of the curve of FIG. 3 shifted due to the biasing of the dipoles, and it should be noted that the X-axis of FIG. 4 is not drawn to scale with the X-axis of FIG. 3. The biasing of elements 1, 2, 3, and 4 causes a more linear portion of the response curve to be centered about the Y-axis of FIG. 4, designated region A, which is the typical region of operation for the magnetoresistive head. The magnetoresistive elements 1, 2, 3, and 4 therefore should be biased so as to be placed into a linear operating region (region A). This biasing of the elements will result in maximum element sensitivity and in the linearization of the magnetoresistive head's operation. Therefore, a more accurate and sensitive device will be achieved.

An auxiliary structure (not shown) is preferably provided so as to properly bias the elements 1, 2, 3, and 4 so as to orient the magnetic dipoles inherent in each in the manner just described. The magnetic dipole orientation angle $\theta$ (theta) is illustrated in FIG. 1. The auxiliary biasing structure might be, for example, adjacent soft magnetic layers deposited over the magnetoresistive elements 1, 2, 3, and 4.

With the embodiment and design criteria for the device of the present invention set forth above, the operation of the device will now be described. In order to provide a detailed description of how the device of the present invention operates, it will first be convenient to analyze the operation of the two-element or original pair head 200 illustrated in FIG. 2.

As a magnetic medium 12 with a magnetic transition 90, located thereon, is passed beneath the elements 1 and 2, signals will be produced by elements 1 and 2. Resistors 31 and 32 are of equal resistance values and current sources 41 and 42 supply equal currents ($I_1$) to the elements 1 and 2, respectively. Therefore, the signals generated by each of the elements 1 and 2 will differ from one another solely as a function of the magnetic field incident upon each of them. As a result, voltage signals $V_1$ and $V_2$ will be generated across elements 1 and 2, respectively.

Figure 5:
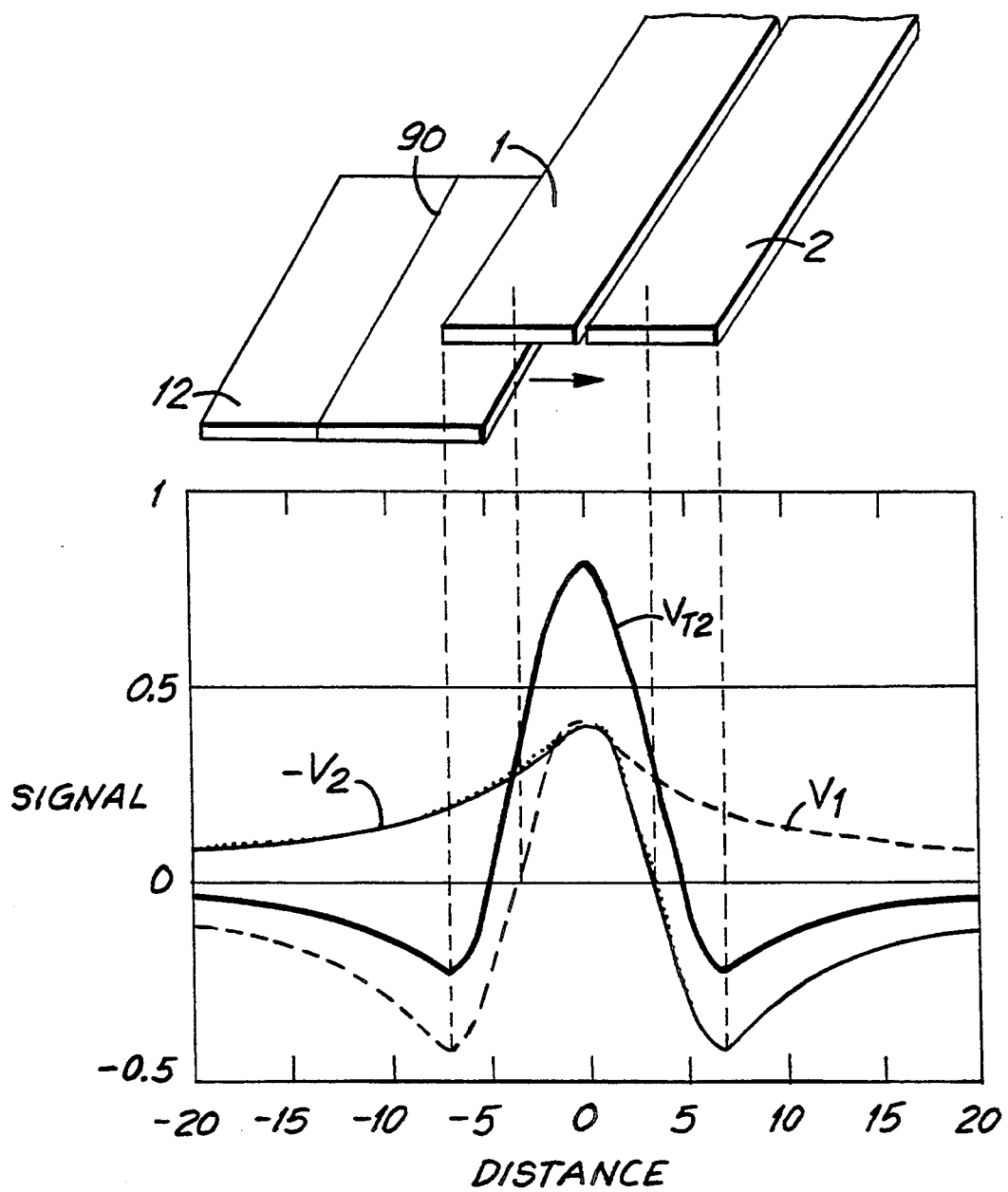
FIG. 5 is an illustration of the signals, inverted where appropriate, produced by each magnetoresistive element of the two-element magnetoresistive head of FIG. 2, along with the corresponding resultant output signal, as a magnetic transition is moved across the magnetoresistive head.

The voltage signals for each of the elements 1 and 2 of the original pair are shown in FIG. 5 along with their spatial relationship to the geometry of the magnetic head element arrangement which is shown at the top of FIG. 5. Note that the inverse, or negative, of signal $V_2$ is shown in FIG. 5 for ease of understanding. This inversion function, performed on voltage signal $V_2$, as well as upon the other appropriate voltage signals as will be described below, is a function of the inverting input of each respective differential amplifier. In this case, differential amplifier 50 performs the inversion function on $V_2$. The resultant signal for the original pair as seen at the output of the differential amplifier 50, denoted $V_{T2}$, is also shown in FIG. 5.

As noted above, FIG. 5 depicts the resulting voltage signal generated across element 1 and the inverse, or negative, of the voltage signal generated across element 2. The signal represented by the broken line is produced by element 1 as the magnetic transition 90 of the magnetic medium 12 passes from left to right, while the solid line represents the inverse, or negative, of the signal produced by element 2 as the magnetic transition 90 continues to move from left to right. It is important to note that it is the algebraic sum (the sum between one signal and the inverse, or negative, of the other signal)

of these signals produced by elements 1 and 2 which results in the output signal $V_{T2}$ shown in FIG. 5.

In FIG. 5, the signal from an individual element crosses zero on the graph at, and is symmetrical about, the centerline of the individual element. The signal in the right element, for example, is maximally positive when the transition is on the left edge, maximally negative when the transition is on the right edge, and zero when the transition is at the center of the element. As the transition moves away from the element, the signal drops off because the magnetic field is strongest when the transition is nearest the element.

Note that the resultant signal obtained by the algebraic sum of the individual signals exhibits substantial negative undershoots, whose peaks spatially correspond to the transition positioned at the outer edge of either element. The undershoots and their associated negative tails occur because the negative peak at the nearer element is much stronger than the signal produced by the farther element. Generally, output signal undershoots and their negative tails are created when signals from any pair of magnetoresistive elements are placed and utilized in a similar configuration. Hence, there will always be undershoots in unshielded magnetoresistive heads of this nature.

Output signal undershoots are an area of serious concern in unshielded horizontal magnetoresistive heads. They are undesirable because the reading circuity (not shown), which accompanies the device of the present invention, incorporates a peak signal detector 80 (shown in FIGS. 1 and 2) for the further processing of the resultant output signals $V_{T2}$ and $V_{T4}$. The circuitry 80 may be set to detect negative peaks as well as positive peaks and, therefore, the existence of these output signal undershoots creates the distinct possibility that an undershoot may be detected as a signal pulse.

Undershoots and their negative tails may also be viewed as a type of interference which destructively interferes with the central pulse peak and other positive portions of the resultant output signal of the magnetoresistive head. This results in decreased signal to interference and decreased signal to noise ratios which are most undesirable in magnetic reading and sensing applications. The present invention provides a device and technique whereby these undershoots can be reduced significantly while at the same time, providing for increased central pulse peak amplitudes. Central pulse peak detection is crucial to the system as it is the data inherent in or derived from these central pulse peaks which is utilized to perform the data processing functions in the device in which the magnetoresistive head is employed.

By reducing the amplitude of the undershoots, an increased signal to interference ratio and an increased signal to noise ratio can be realized. Further, these above-described improvements to the system output signal can be obtained without significantly changing the resolution of the head. In this manner, pulse width remains the same and, therefore, signal transmission data rates will not be appreciably affected.

In a preferred embodiment shown in FIG. 1, the magnetoresistive elements 1 and 2 of the original pair may be 24 μm wide and separated by a gap 10 of 6 μm. The head-media separation is preferably 10 μm. The outboard elements 3 and 4 are taken to be 58 μm wide and positioned 2 μm away from the elements of the original pair. Hence, gaps 20 and 30 are each 6 μm wide. The sensitivities of the outboard pair elements are approximately 25% of the original pair elements, so that $k=0.25$. This means that in a given magnetic field, elements 3 and 4 will produce signals which will be 25% of the magnitude of those signals produced across original pair elements 1 and 2.

The processing order of the individual element signals, and their intermediate pair resultant signals, is solely dependent upon the algebraic relationship chosen to represent the resultant output signal for the head. As a result, one may use alternative hardware and circuit arrangements and processing orders to arrive at the system resultant output signal. The present device performs the above processing according to FIG. 1 by subtracting the resultant signal $V_{60}$ of the outboard pair from the resultant signal $V_{50}$ of the original pair. As will be described and be made apparent below, any number of additional element pairs or outboard pairs may be employed to further improve the overall system output signal characteristics so long as the element signals, and the intermediate pair resultant signals, are processed in accordance with the appropriate algebraic relationship.

The resultant signal $V_{T2}$ for the original pair magnetoresistive head is given by the relationship:

$$V_{T2} = V_1 - V_2 \qquad (1)$$

where $V_{T2}$ = the resultant output signal of the system;
$V_1$ = the signal generated across element 1; and
$V_2$ = the signal generated across element 2.

Similarly, the resultant signal $V_{T4}$ obtained for the four-element head of FIG. 1 is given by the relationship:

$$V_{T4} = (V_1 - V_2) - (V_4 - V_3) \qquad (2)$$

where $V_{T4}$ = the resultant output signal of the four-element system;
$V_2$ = the signal generated across element 1;
$V_2$ = the signal generated across element 2;
$V_3$ = the signal generated across element 3; and
$V_4$ = the signal generated across element 4.

The hardware and circuitry of the present invention as shown in FIG. 1 is designed to realize the mathematical relationship for $V_{T4}$ as set forth in Eq. (2) above.

Figure 6A:
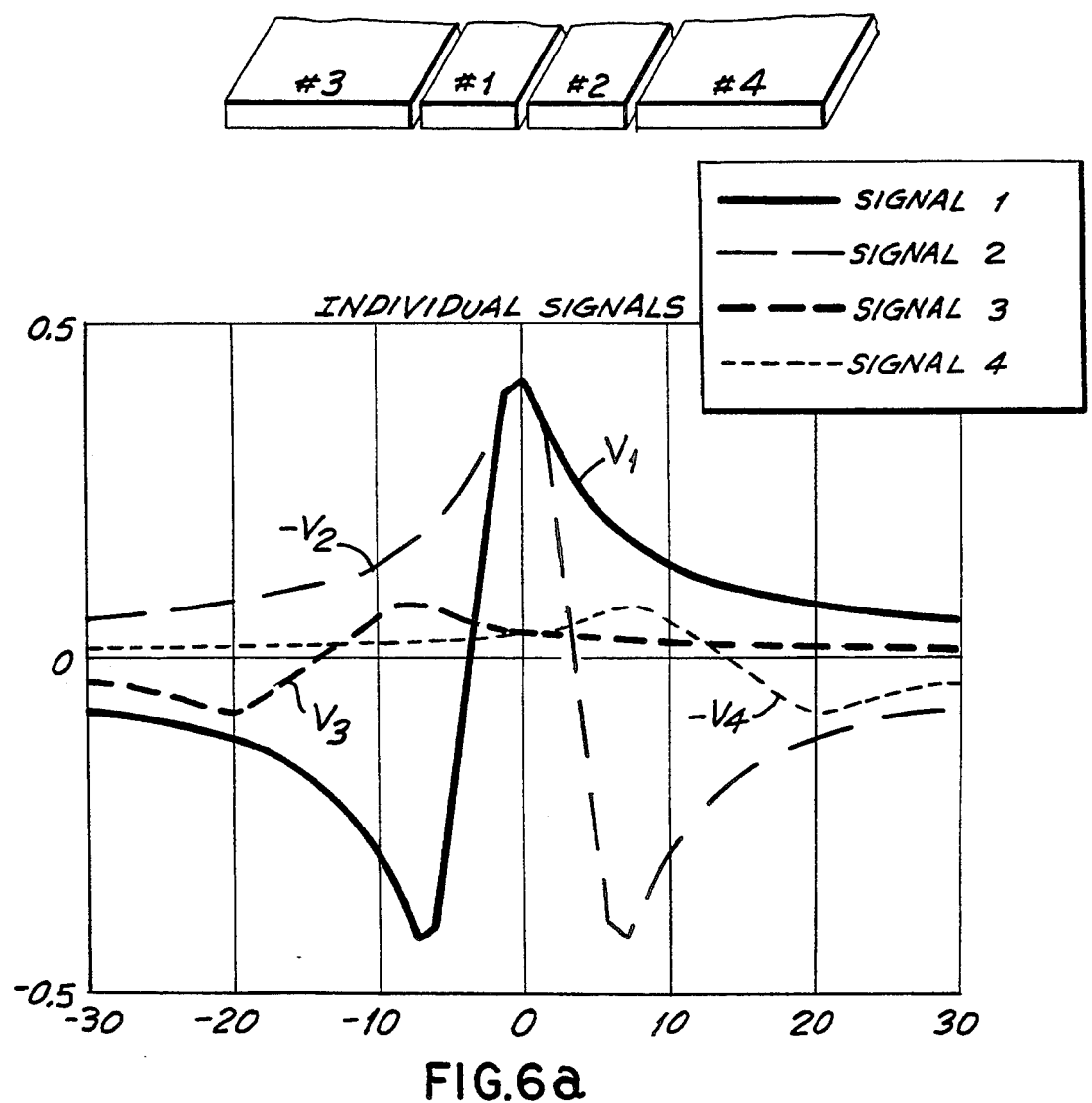
FIG. 6(a) is an illustration of the individual signals generated across each of the elements of the two-pair or four-element horizontal unshielded magnetoresistive head of FIG. 1, with such pertinent signals herein inverted where appropriate.

FIG. 6(a) illustrates the elemental arrangement of the magnetoresistive head of the present invention along with the signals $V_1$, $V_2$, $V_3$, and $V_4$ produced by each of the elements 1, 2, 3, and 4, respectively, as the magnetic medium 12, having magnetic transition 90, passes beneath the head from left to right. The signals $V_1$ and $V_3$, along with the inverse, or negative, of signals $V_2$ and $V_4$ are illustrated in FIG. 6(a) in relationship to one another and also in spatial relationship to the elemental arrangement depicted at the top of FIG. 6(a).

Figure 6B:
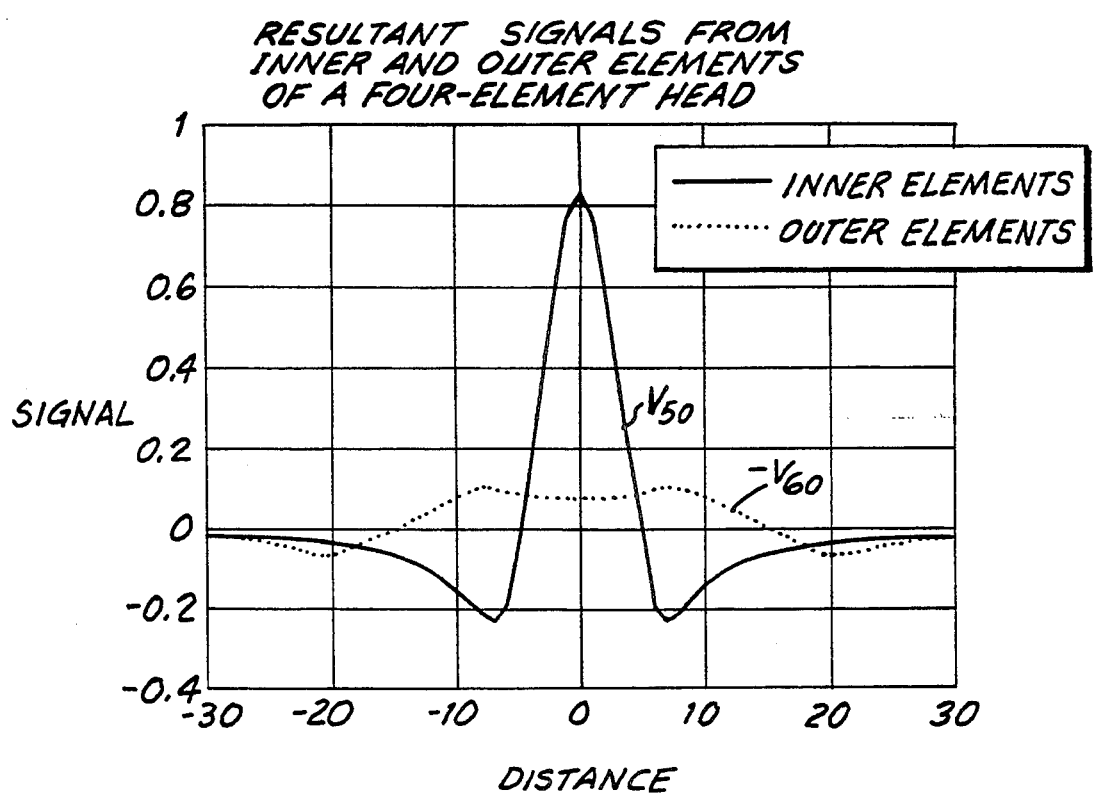
FIG. 6(b) is an illustration of the resultant signals, inverted where appropriate, produced across each pair of elements in the two-pair or four-element horizontal unshielded magnetoresistive head of FIG. 1.

The systematic processing of the signals generated across each of elements 1, 2, 3, and 4 is performed in accordance with Eq. (2) to arrive at the resultant output signal $V_{T4}$ as described below. The signals generated across the original pair elements 1 and 2, $V_1$ and $V_2$, respectively, are fed into differential amplifier 50 with the resultant signal $V_{50}$ being present at the output of the differential amplifier 50. The signals generated across the outboard pair elements 3 and 4, $V_3$ and $V_4$, respectively, are fed into differential amplifier 60 with the resultant signal $V_{60}$ being present at the output of differential amplifier 60. FIG. 6(b) illustrates a graphical representation of signal $V_{50}$ and the inverse, or negative, of signal $V_{60}$. Due to the reduced sensitivity of the outboard pair elements 3 and 4, the resultant signal $V_{60}$ will have an amplitude reduced by a factor k, relative to the magnitude of the signal $V_{50}$.

Figure 7:
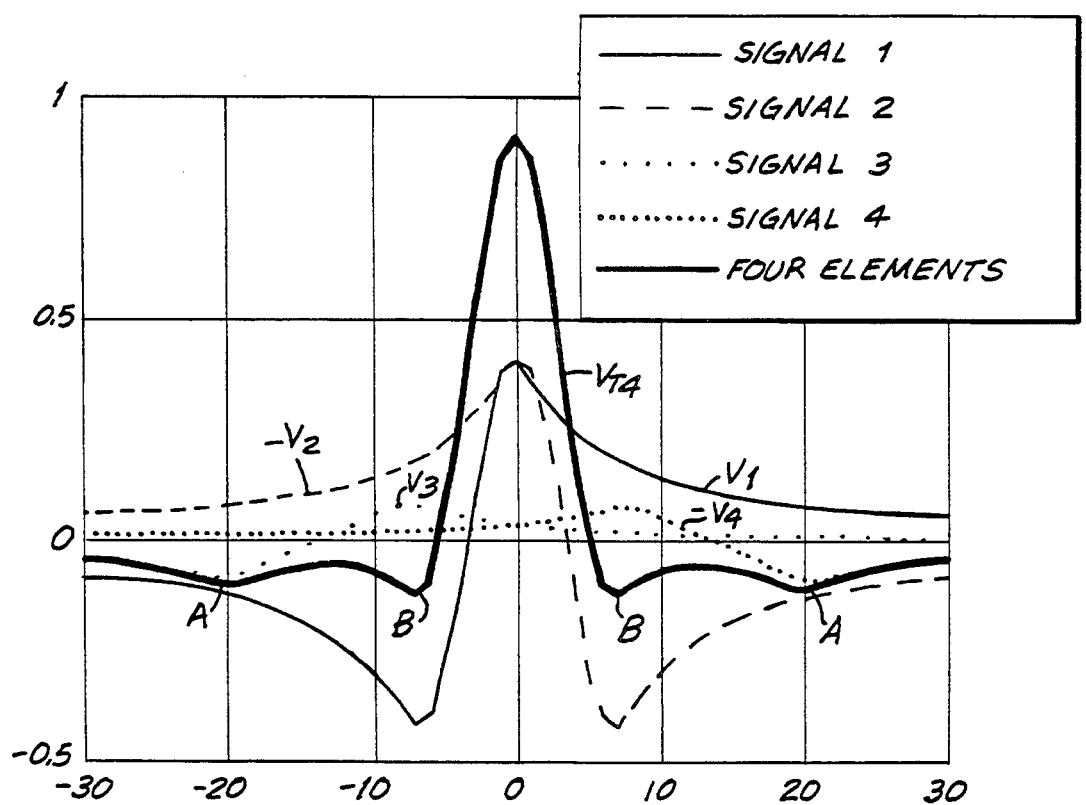
FIG. 7 is an illustration of the resultant output signal for the two-pair or four-element horizontal unshielded magnetoresistive head of FIG. 1 shown with the individual signals, inverted where appropriate, generated across each element.

The resultant voltage signal $V_{50}$ and the inverse, or negative, of signal $V_{60}$ for the original pair and the outboard pair, respectively, are fed into the inputs of differential amplifier 70. FIG. 7 depicts the output signal $V_{T4}$ of differential amplifier 70, along with the element signals $V_1$ and $V_3$ and the inverse, or negative, of signals $V_2$ and $V_4$. The system resultant signal $V_{T4}$ for the four-element head of the present invention has reduced output signal undershoots and increased central pulse peak amplitudes as compared to the output of the original pair head shown in FIG. 5. Further, these improvements are attained without a significant change in the resolution of the head, and without appreciably affecting the data transmission rate of the head.

Figure 8:
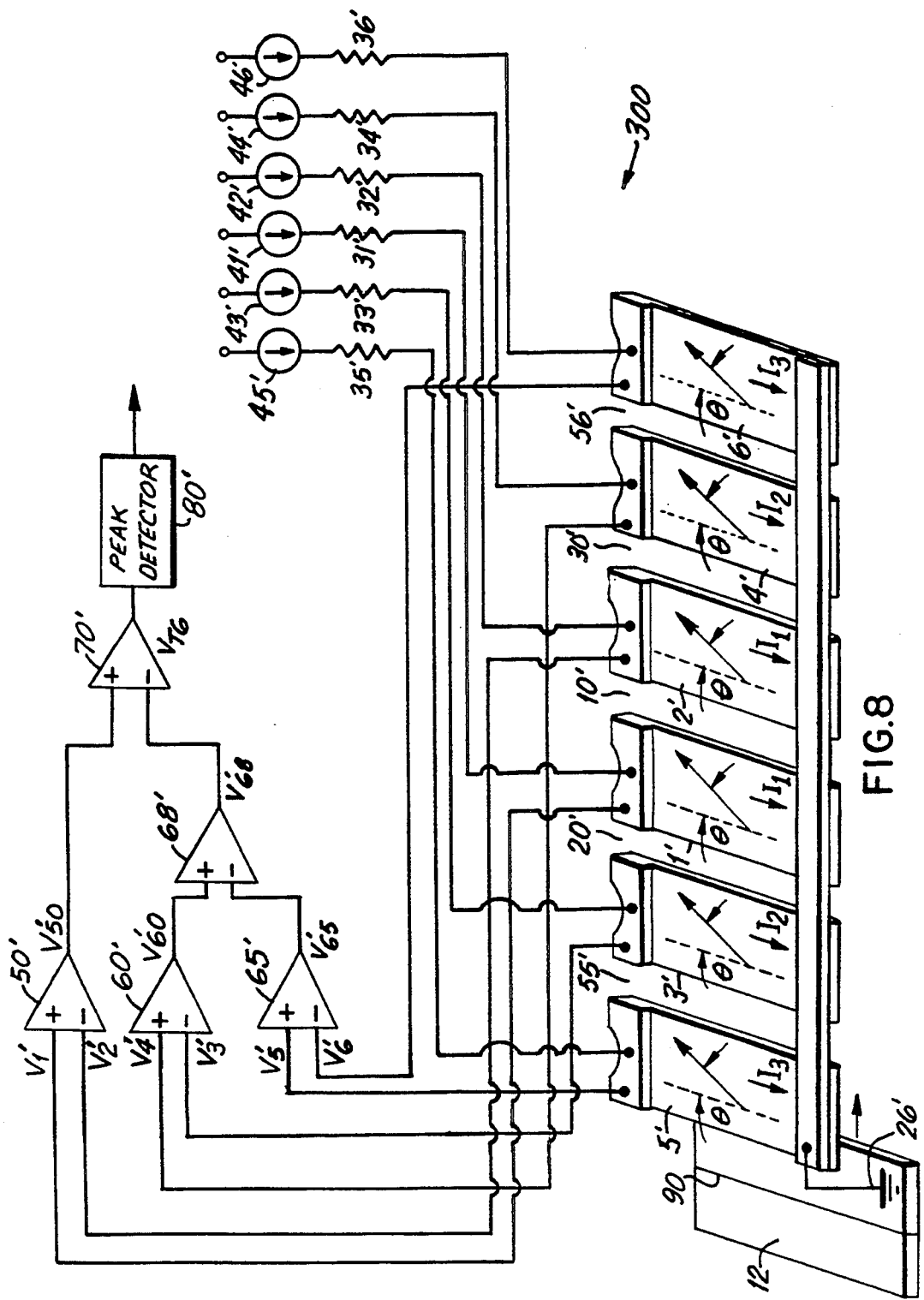
FIG. 8 is an illustration of a three-pair or six-element horizontal unshielded magnetoresistive head shown with its associated hardware and circuitry.

The amplitude of output signal undershoots may be reduced even further, and the amplitude of the central pulse peak increased or enhanced even further, by the employment of additional outboard element pairs. FIG. 8 illustrates the employment of an additional pair of outboard elements, comprising elements 5' and 6' along with their associated hardware and circuitry, added to the embodiment of FIG. 1. A three-pair or six-element magnetoresistive head 300 is thus obtained. The second outboard pair of elements 5' and 6' along with elements 1', 2', 3' and 4' similarly lie parallel to one another and in the same horizontal plane. Due to the fact that the elements all lie in the same horizontal plane, the spacing between elements 5' and 6' should be such so as to allow elements 1', 2', 3' and 4' to fit thereinbetween with sufficient gap space remaining for gaps to exist between elements 5' and 3' and between elements 6' and 4'.

In FIG. 8, the system resultant signal $V_{T6}$ is obtained from the following relationship:

$$V_{T6} = V_1 + V_3 + V_5 - V_2 - V_4 - V_6 \quad (3)$$

which may equivalently be represented as:

$$V_{T6} = (V_1 - V_2) - ((V_4 - V_3) + (V_6 - V_5)) \quad (4)$$

The circuitry of FIG. 8 is designed in accordance with Eq. (4). It should be noted that Eq. (4) is one of several algebraic equivalents to Eq. (3), and as such, the embodiment of FIG. 8 is only one of a number of possible embodiments which can be employed for the six-element head. Generally, any circuit configuration which will generate the algebraic representation for a resultant output signal will be a viable circuit for a magnetoresistive head of any given number of element pairs.

Elements 1', 2', 3', 4', 5', and 6' are connected to one another by an electrical conductor cross member 25' which serves to electrically connect the magnetoresistive elements 1', 2', 3', 4', 5', and 6', as well as, to electrically connect them to a common electrical point 26' which is typically system ground. Elements 1' and 2' are separated by gap 10' while elements 3' and 1' are separated by gap 20', and elements 4' and 2' are separated by gap 30'. In addition, elements 5' and 3' are separated by gap 55' and elements 6' and 4' are separated by gap 56'. Each of the gaps 10', 20', 30', 55' and 56' may be filled with air or any other type of dielectric material. The ungrounded edges of each of the magnetoresistive elements 1', 2', 3', 4', 5', and 6' are connected through resistors 31', 32', 33', 34', 35', and 36', respectively, to constant current supplies 41', 42', 43', 44', 45', and 46' supplying currents $I_1$, $I_2$ and $I_3$, respectively.

In accordance with Eq. (4) above, the ungrounded edges of the magnetoresistive elements 1', 2', 3', 4', 5', and 6' are connected to their respective differential amplifiers in the following manner. The ungrounded end of magnetoresistive element 1' is connected to the positive, or non-inverting, input of differential amplifier 50'. The ungrounded end of magnetoresistive element 2' is connected to the negative, or inverting, input of differential amplifier 50'. The ungrounded end of magnetoresistive element 3' is connected to the negative, or inverting, input of differential amplifier 60' while the ungrounded end of magnetoresistive element 4' is connected to the positive, or non-inverting, input of differential amplifier 60'. The ungrounded end of magnetoresistive element 5' is connected to the positive, or non-inverting, input of differential amplifier 65' while the ungrounded end of magnetoresistive element 6' is connected to the negative, or inverting, input of differential amplifier 65'.

The remaining hardware connections which are required to realize the resultant signal $V_{T6}$ for the embodiment of FIG. 8 are set forth as follows. The output signal $V_{50}'$ of differential amplifier 50', which represents the difference between element voltages $V_1'$ and $V_2'$, is fed into the positive, or non-inverting, input of differential amplifier 70'. The output signal $V_{60}'$, which represents the difference between element voltages $V_4'$ and $V_3'$, is fed into the positive, or non-inverting, input of the differential amplifier 68'. The output signal $V_{65}'$ of differential amplifier 65', which represents the difference between element voltages $V_5'$ and $V_6'$, is fed into the negative, or inverting, input of differential amplifier 68'. The output signal $V_{68}'$ of differential amplifier 68' is fed into the negative, or inverting, input of differential amplifier 70'. The resultant output signal $V_{T6}$ is obtained at the output of differential amplifier 70'.

Figure 9A:
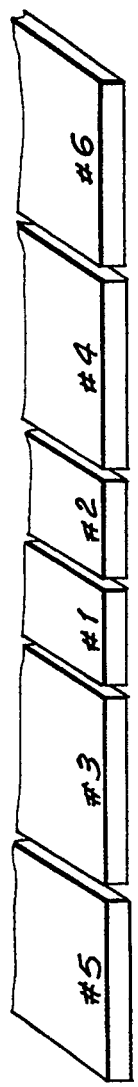
FIG. 9(a) is an illustration of the individual signals generated across each of the elements of the three-pair or six-element horizontal unshielded magnetoresistive head of FIG. 8, with such pertinent signals being inverted where appropriate.
Figure 9A:
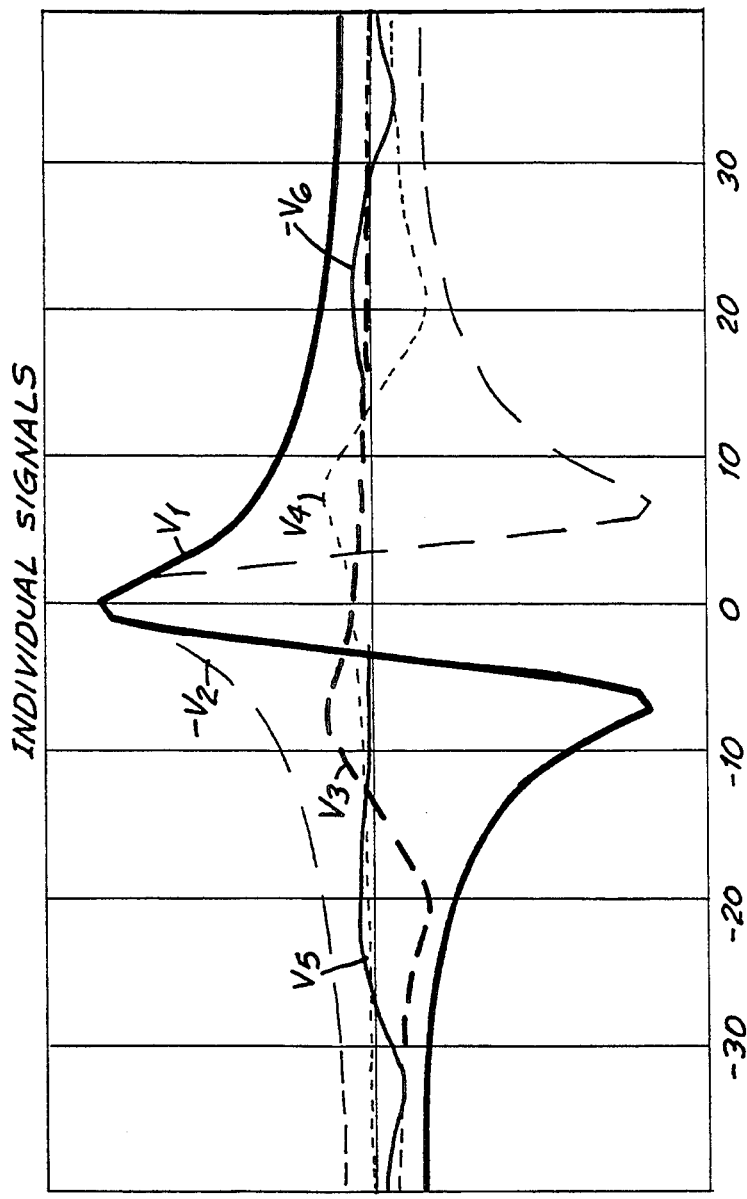
Figure 9B:
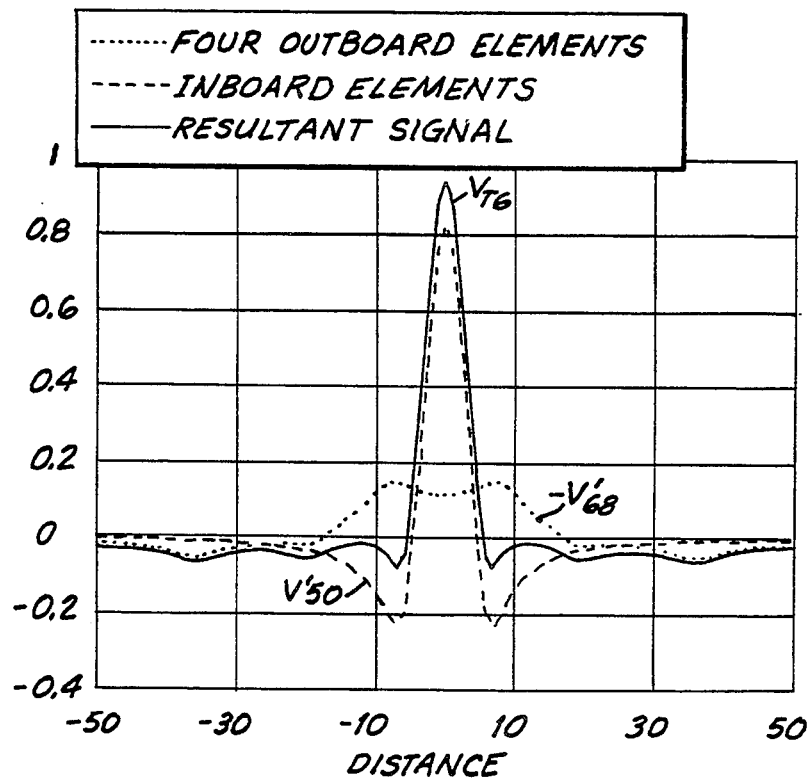
FIG. 9(b) is an illustration of the resultant signal of the original element pair and the resultant signal of the combination of the outboard element pairs, inverted where appropriate, of the magnetoresistive head of FIG. 8.
Figure 10:
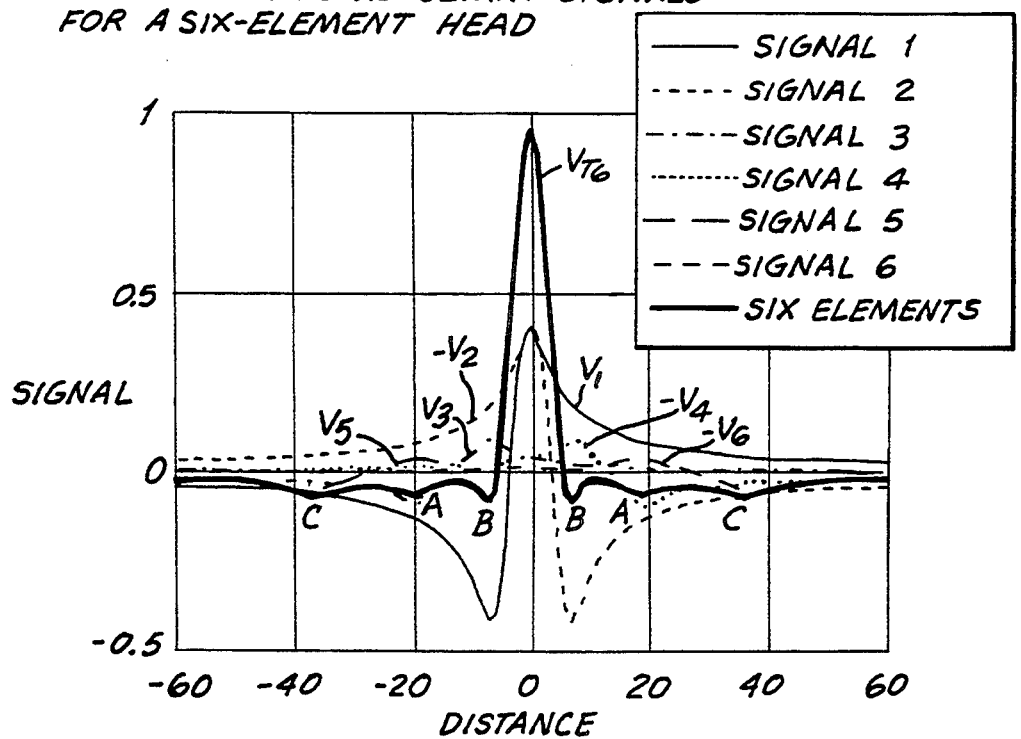
FIG. 10 is an illustration of the system output resultant signal for the three-pair or six-element horizontal unshielded magnetoresistive head of FIG. 8 shown with the individual signals, inverted where appropriate, generated across each element.

FIG. 9(i a) illustrates the signals, inverted where appropriate, generated across each of the elements 1', 2', 3', 4', 5' and 6' as a magnetic medium is passed therebeneath from left to right, which are denoted $V_1'$, $-V_2'$, $V_3'$, $-V_4'$, $V_5'$, and $-V_6'$, respectively. Referring to FIG. 8, the resultant signal $V_{60}'$ for the first outboard pair, elements 3' and 4', is algebraically combined with the inverse, or negative, of the resultant signal $V_{65}'$ for the second outboard pair, elements 5' and 6', so as to yield resultant signal $V_{68}'$, at the output of differential amplifier 68'. FIG. 9(b) depicts the resultant signal $V_{50}'$ from the original pair of elements 1' and 2' along with the inverse, or negative, of the resultant signal $V_{68}'$ from the outboard pairs of elements 3' and 4', and 5' and 6'. The resultant output signal $V_{T6}$ for the six-element head is also illustrated. FIG. 10 illustrates $V_{T6}$ along with the individual signals $V_1'$, $V_3'$, $V_5'$, and the inverse, or negative, of signals $V_2'$, $V_4'$ and $V_6'$ generated across each of the elements 1', 2', 3', 4', 5', and 6' respectively.

Figure 11A:
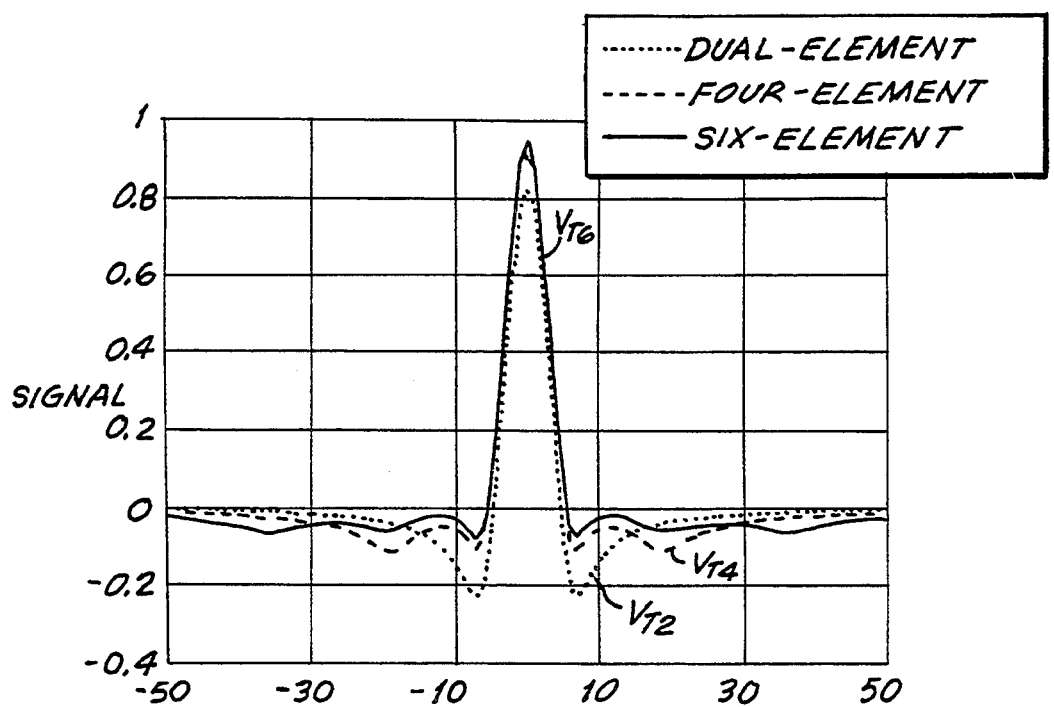
FIG. 11(a) is an illustration of the resultant output signals for each of the original pair or two-element, the two-pair or four-element, and the three-pair or six-element, magnetoresistive heads, illustrated in relation to one another.

In order to more clearly appreciate the benefits and advantages of the present invention, a comparison of the resultant output signals for each of the two-element head of FIG. 2 denoted $V_{T2}$, the four-element head of FIG. 1 denoted $V_{T4}$, and the six-element head of FIG. 8 denoted $V_{T6}$, are depicted in relation to one another in FIG. 11(a). As can be seen, as the number of outboard pairs of elements employed are increased, the amplitude of output signal undershoots are reduced even further while the amplitude of the resulting central pulse peaks are increased. Moreover, there is no significant reduction in the head's resolution, or half width at half amplitude of the central pulse peak.

Figure 11B:
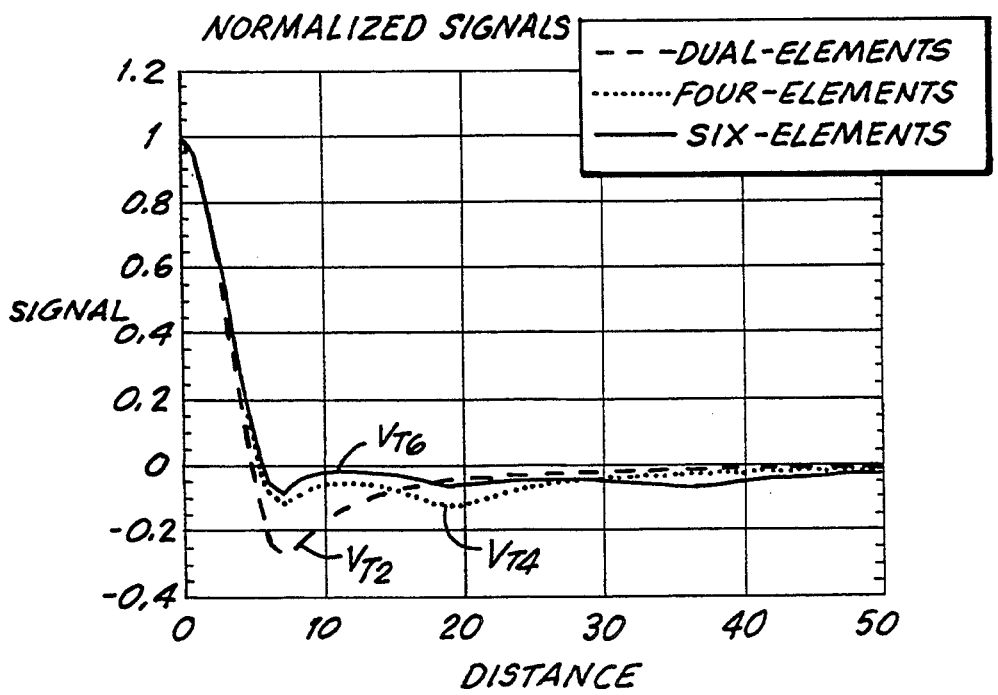
FIG. 11(b) is an illustration of the resultant output signals, normalized in amplitude, for each of the original pair or two-element, the two-pair or four-element, and the three-pair or six-element, magnetoresistive heads illustrated in relation to one another.

FIG. 11(b) illustrates the output signals for each of the original pair or two-element head denoted $V_{T2}$, the four-element head denoted $V_{T4}$, and the six-element head denoted $V_{T6}$, normalized in amplitude and depicted in relation to one another. The resultant output signals $V_{T2}$, $V_{T4}$, and $V_{T6}$ are plotted against the position of the magnetic transition 90 of the magnetic material 12 being sensed or read from the center of the gap 10. The normalized signals are obtained by dividing each signal by its peak maximum value so as to obtain maximum amplitudes of 1.0 for each of $V_{T2}$, $V_{T4}$ and $V_{T6}$. FIG. 11(b) illustrates that as the number of outboard pairs of elements are increased, the amplitude of the undershoots of the resulting output signal is decreased.

By adding additional outboard pairs of elements, even further reductions in output signal undershoot amplitude and further increases in central pulse peak amplitudes can be realized.

Referring back to FIG. 7, note that the decrease in relative amplitude of the output signal undershoots is achieved with the two-pair or four-element head by creating secondary undershoots which are identified by the letters A outboard of the primary undershoots which are identified by the letters B. For these examples the outboard sensor geometries and sensitivities, k, were chosen so that the amplitudes of both undershoots would be about the same. It has been calculated that further decreases in the amplitude of the inner undershoots B resulted in increases in the amplitude of the outer undershoots denoted by the letters A. Referring to FIG. 10, the output signal $V_{T6}$ of the embodiment of FIG. 8 has undershoots B and undershoots A along with tertiary undershoots C which were generated by the addition of the second outboard pair of elements 5' and 6'. It is clear from FIG. 10 that the amplitude of these outer undershoots A, generated by the first outboard pair, can be similarly reduced by placing the additional outboard pair of elements 5' and 6', which are also chosen to be relatively insensitive to the elements of the first outboard pair, outside of or outboard of the two-pair or four-element arrangement of FIG. 1 as illustrated in FIG. 8. Further, appropriate adjustments must be made to the geometries and sensitivities of the appropriate elements so as to obtain three equal, but smaller, undershoots. Thus, additional improvements could be realized with the employment of yet additional outboard element pairs.

While the improved magnetoresistive head of the present invention has been described without the attendant fabrication and/or manufacturing techniques, those manufacturing and/or fabrication techniques disclosed in and applicable to the magnetoresistive head described in U.S. Pat. No. 5,155,643 are equally applicable to the magnetoresistive elements and attendant components of the present invention.

Figure 12:
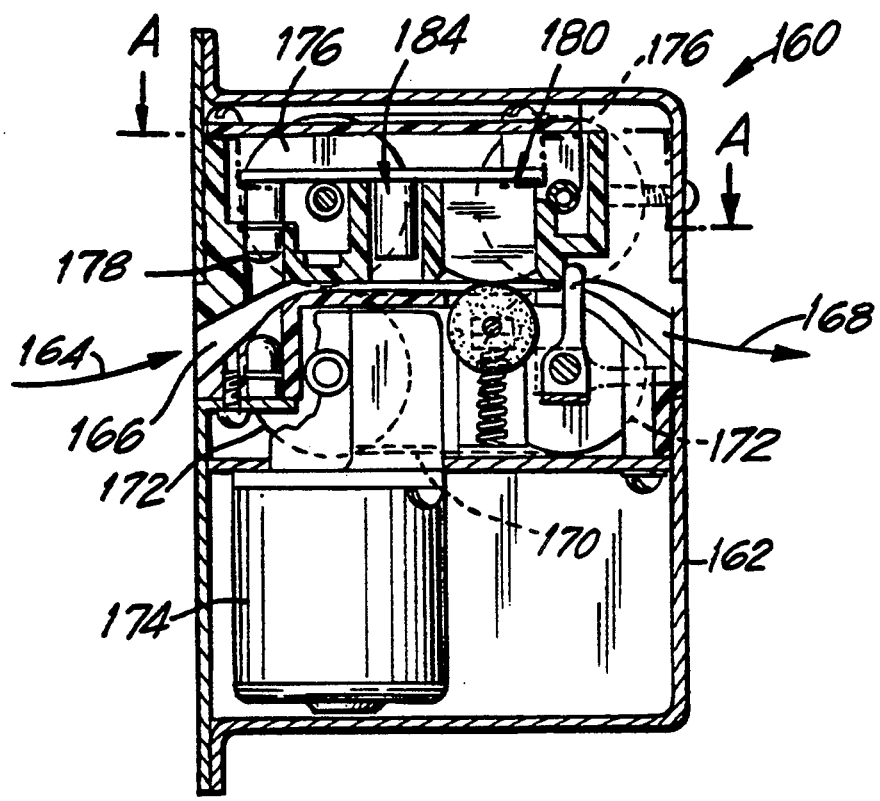
FIGS. 12 and 13 illustrate the utilization of the magnetoresistive heads of FIGS. 1 and 8 in a currency validator.
Figure 13:
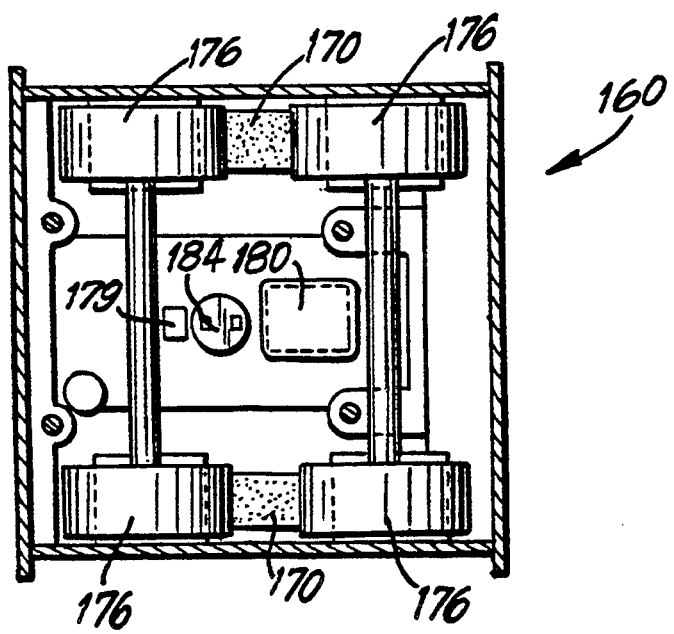

The present invention may be used in a currency validator as one of a plurality of sensors positioned to encounter a banknote and generate electrical signals in response to certain features of said banknote. FIGS. 12 and 13 show a currency validator 160 having a housing 162 containing a banknote passageway 164 having an entry 166 and an exit 168. Tractor belts 170 are supported by parallel rollers 172 which are operably connected to a motor 174. The motor controlled belts 170 act to advance a banknote or other magnetic media past a transmissive sensor 178, a reflective sensor 184, and a magnetic sensor 180. In a preferred embodiment of the present invention, the magnetic sensor 180 is an unshielded horizontal head with multiple pairs of magnetoresistive elements such as-devices 100 or 300 described in the present application. The magnetic sensor 180 generates electrical signals in response to magnetic information inherent on the surface of a banknote which is fed immediately beneath the head.

A permanent magnet 179 is located above the passageway between the entry 166 and the magnetic sensor 180. The magnet 179 enhances the magnetic transition data on the banknote so that the signal produced by the magnetic sensor 180 is also enhanced, thereby ensuring accurate detection of magnetic information on the banknote.

While the present invention has been described in one preferred embodiment in conjunction with its use in a currency validator, it is also envisioned that modifications may easily be made to the present invention so as to allow its employment in applications such as in coin sensing, coin tube content determination, card readers, as a substitute for widely used Hall effect sensors, and in other applications which are, or may become, known to those skilled in the art. Further, the present invention may be utilized in conjunction with a fixed magnet, or with other functionally equivalent means that other external magnetic field generating devices are associated.

In short, the present invention may be employed in magnetic sensing and reading applications, with its attendant improved signal to interference and signal to noise ratios and fabrication and cost advantages.

The description of the preferred embodiment of the present invention is meant to be merely illustrative and is not to be construed as a limitation thereof. Therefore, the present invention covers all modifications, changes, and alternatives in its design, methods of fabrication, and method of use falling within the scope of the principles taught herein and the claims which follow.

We claim:

1. An unshielded horizontal magnetoresistive head for sensing magnetic data, comprising:
   a first pair of unshielded magnetoresistive elements separated by a gap having a predetermined gap size that enables one magnetic transition to appear during a given instant of time;
   at least one outboard pair of unshielded horizontal magnetoresistive elements, wherein the first pair is situated between the outboard pair elements, for reducing the negative portions of the output signal amplitude and for increasing the central pulse peak amplitude of the output signal;
   a conductive cross member connected at one end of each of the elements to operatively connect the elements together and to a common electrical point; and
   differential voltage sensing circuitry connected to each pair of elements to sense variations in the voltage when magnetic data is sensed by the head and to generate signals in response to the variations.

2. The apparatus of claim 1, further comprising:
   at least one constant current source connected through a resistor to each pair of magnetoresistive elements such that each element of a pair contains substantially the same current.

3. The apparatus of claim 1, further comprising:

signal processing circuitry including a peak signal detector to further process the signals generated by the differential voltage sensing circuitry.

4. The apparatus of claim 1, wherein the common electrical point is system ground.

5. The apparatus of claim 1, wherein two outboard pairs are utilized.

6. The apparatus of claim 1, wherein the optimal number of outboard pairs of horizontal magnetoresistive elements depends upon the required sensitivity of the unshielded horizontal magnetoresistive head.

7. A method of fabrication of an unshielded horizontal magnetoresistive head for sensing magnetic data, comprising the steps of:

patterning pairs of magnetoresistive elements such that a first pair and at least one outboard pair are formed, wherein the outboard pair functions to reduce the negative portions of the output signal amplitude and to increase the central pulse peak amplitude of the output signal;

connecting one end of each magnetoresistive element to a common electrical point such that the first pair of elements are separated by a gap having a predetermined gap size that enables one magnetic transition to appear during a given instant of time, and such that the first pair is situated between the outboard pair elements;

connecting the opposite unconnected ends of the magnetoresistive element pairs to differential voltage sensing circuitry; and connecting the output signal of the differential voltage sensing circuitry to a differential voltage sensing circuit to obtain a resultant signal for the head.

8. The method of fabrication of an unshielded horizontal magnetoresistive head of claim 7, wherein the response of an outboard pair to a given magnetic field is a fraction of the response of the first inner pair to the same magnetic field.

9. The method of fabrication of an unshielded magnetoresistive head of claim 7, wherein gaps exist between the outboard pair elements and the first pair elements.

10. The method of fabrication of an unshielded horizontal magnetoresistive head of claim 9, wherein the gaps are composed of a dielectric material and the gap sizes depend upon the application.

11. A method for sensing magnetic transition data and for combining electrical signals generated by a first pair and at least one outboard pair of magnetoresistive elements of an unshielded horizontal magnetoresistive sensor, wherein the first pair elements are separated by a gap having a predetermined gap size that enables one magnetic transition to appear during a given instant of time, and wherein the first pair is situated between the outboard pair elements, characterized by a system resultant signal having decreased negative amplitude signal portions and an increased positive central peak amplitude signal while maintaining satisfactory device resolution, comprising the steps of:

transporting material containing magnetic transition data past the first pair and the outboard pair of magnetoresistive elements of the unshielded horizontal magnetoresistive sensor;

sensing magnetic transitions occurring in the magnetic data;

generating first signals corresponding to the magnetic data sensed by the first pair of magnetoresistive elements with a first differential voltage sensing circuit;

generating outboard signals corresponding to the magnetic data sensed by the outboard pair of magnetoresistive elements with an outboard differential voltage sensing circuit;

combining the generated first and outboard signals with a resultant differential voltage sensing circuit to obtain a resultant output signal; and processing the resultant output signal with signal processing circuitry to obtain a response signal for the sensor.

12. The method of sensing magnetic transition data of claim 11, wherein the differential voltage sensing circuitry comprises differential amplifiers.

13. The method of sensing magnetic transition data of claim 11, wherein the differential voltage sensing circuitry comprises operational amplifiers.

* * * * *

UNITED STATES PATENT AND TRADEMARK OFFICE
CERTIFICATE OF CORRECTION

PATENT NO. : 5,378,885
DATED : January 3, 1995
INVENTOR(S) : Jones, Jr., et al

It is certified that error appears in the above-indentified patent and that said Letters Patent is hereby corrected as shown below:

Col. 2, line 9, insert --discloses-- after "5,155,643".

Col. 5, line 45, change "$VT_{T4}$" to --$V_{T4}$--.

Col. 10, line 38, change "$V_2$" to --$V_1$--.

Col. 12, line 39, change "(i a)" to --(a)--.

Col. 14, line 5, delete "-" between "as" and "devices".

Signed and Sealed this

Twenty-seventh Day of June, 1995

Attest:

BRUCE LEHMAN

Attesting Officer     Commissioner of Patents and Trademarks